(12) United States Patent
Song

(10) Patent No.: US 10,475,857 B2
(45) Date of Patent: Nov. 12, 2019

(54) DISPLAY DEVICE COLOR FILTER PATTERNS AND A BLACK MATRIX

(71) Applicant: SAMSUNG DISPLAY CO., LTD., Yongin-si, Gyeonggi-do (KR)

(72) Inventor: Hyun Gue Song, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/865,481

(22) Filed: Jan. 9, 2018

(65) Prior Publication Data

US 2018/0197922 A1 Jul. 12, 2018

(30) Foreign Application Priority Data

Jan. 11, 2017 (KR) .................. 10-2017-0004210

(51) Int. Cl.
*H01L 27/32* (2006.01)
*H01L 51/52* (2006.01)

(52) U.S. Cl.
CPC ........ *H01L 27/322* (2013.01); *H01L 51/5203* (2013.01); *H01L 51/5281* (2013.01); *H01L 27/3216* (2013.01)

(58) Field of Classification Search
CPC .............. H01L 27/322; H01L 27/3211; H01L 27/3244; H01L 51/524
See application file for complete search history.

(56) References Cited

U.S. PATENT DOCUMENTS 6,911,772 B2 6/2005 Cok
7,180,238 B2 2/2007 Winters
2014/0028181 A1* 1/2014 Lee .................. H05B 33/14
313/504
2015/0069362 A1* 3/2015 Ito .................. H01L 27/323
257/40
2015/0311269 A1* 10/2015 Hsu .................. H01L 27/3216
257/88

(Continued)

FOREIGN PATENT DOCUMENTS

EP 1 372 200 8/2012

OTHER PUBLICATIONS

Featuring, "Full-Color Organic EL Panels Based on Sony's Unique "Super Top Emission" Technology", 2004, 4 pages.
Sony OLED, "Trimaster EL", Sony Corporation, 2014, 4 pages.

*Primary Examiner* — Dung A. Le
(74) *Attorney, Agent, or Firm* — F. Chau & Associates, LLC

(57) ABSTRACT

A display device includes a first substrate including a pixel region and a peripheral region at least partially surrounding the pixel region and a plurality of pixels disposed in the pixel region. The plurality of pixels includes first, second and third sub-pixels each having a light emitting region. The display device further includes light emitting elements respectively disposed in the light emitting regions of the first to third sub-pixels and a color conversion layer having color filter patterns corresponding to respective light emitting elements. At least one of the color filter patterns has a size smaller than that of the light emitting elements in a first direction of the first substrate, and the rest of the color filter patterns has a size larger than that of the light emitting elements in the first direction of the first substrate.

19 Claims, 6 Drawing Sheets

(56) References Cited

U.S. PATENT DOCUMENTS

| | | | |
|---|---|---|---|
| 2016/0079311 A1* | 3/2016 | Lim | H01L 27/322 257/40 |
| 2017/0263691 A1* | 9/2017 | Seo | G02F 1/133504 |
| 2018/0197921 A1* | 7/2018 | Kim | H01L 27/322 |
| 2018/0269417 A1* | 9/2018 | Sudo | H01L 51/5206 |

* cited by examiner

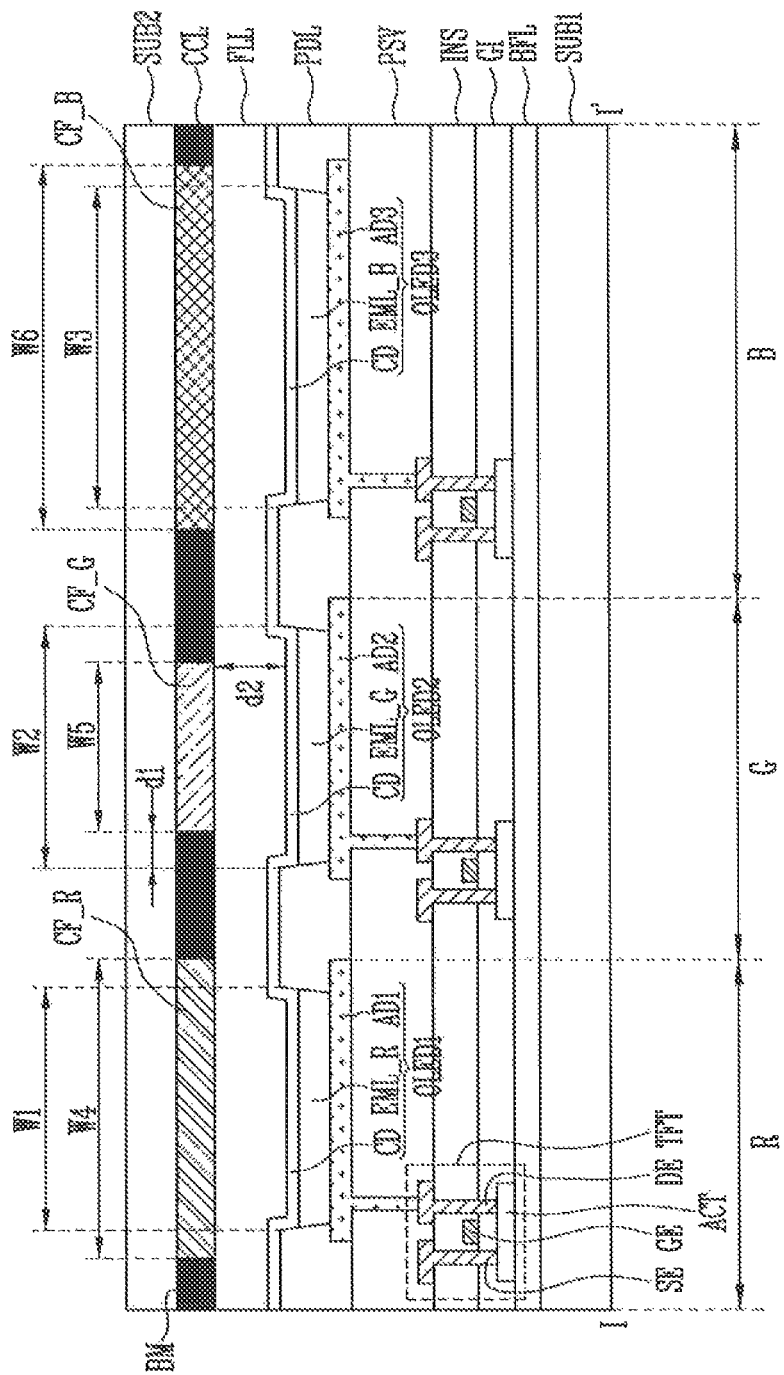

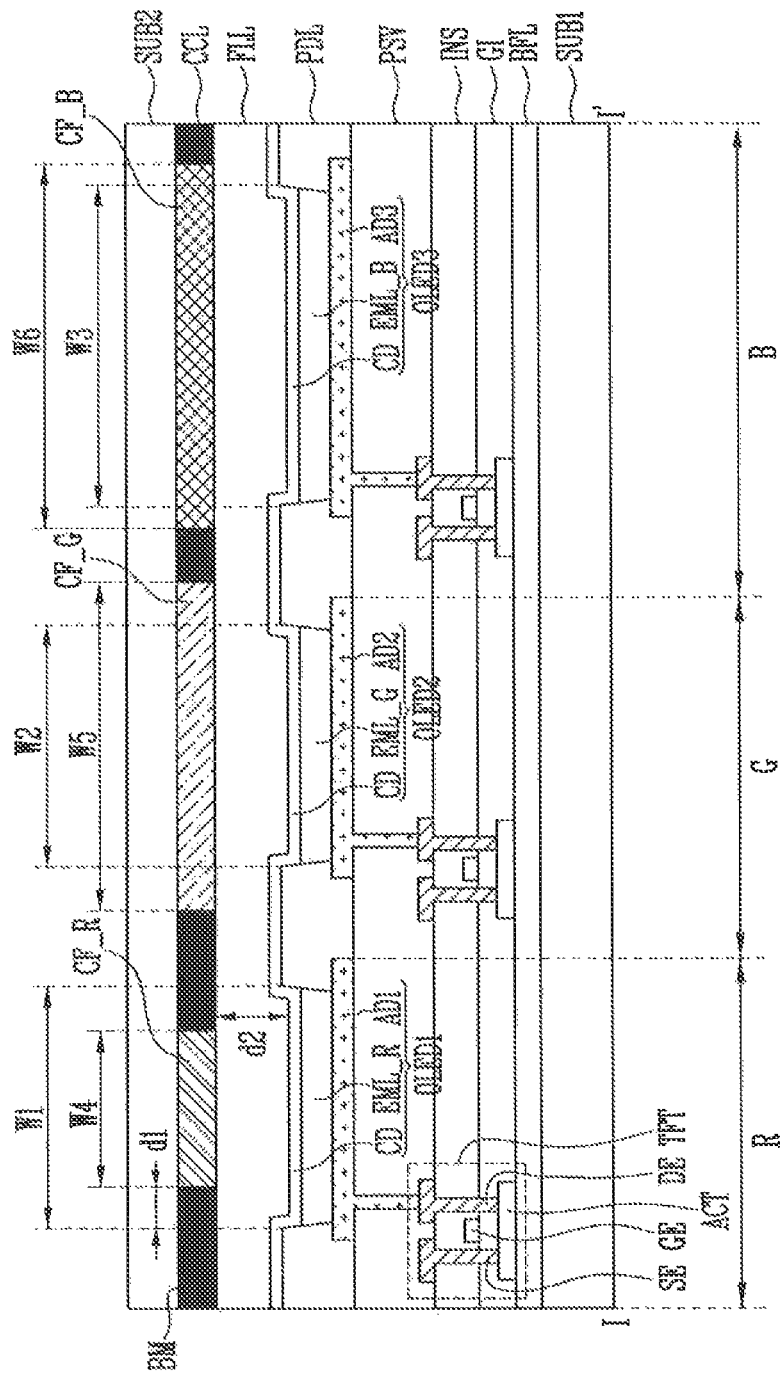

DISPLAY DEVICE COLOR FILTER PATTERNS AND A BLACK MATRIX

CROSS-REFERENCE TO RELATED APPLICATION

The present application claims priority under 35 U.S.C. § 119 to Korean Patent Application No. 10-2017-0004210, filed on Jan. 11, 2017, in the Korean Intellectual Property Office, the disclosure of which is incorporated by reference herein in its entirety.

TECHNICAL FIELD

Exemplary embodiments of the present invention relate to a display device, and more particularly, to a display device including color filter patterns and a black matrix.

DISCUSSION OF THE RELATED ART

Organic light emitting displays are self-luminescent devices that have a relatively wide viewing angle, a relatively high contrast, a relatively fast response time, a relatively high brightness, and good response rate characteristics. In addition, the organic light emitting displays can efficiently use power and display a multicolor image.

Currently, flexible organic light emitting displays are under development. Accordingly, an organic light emitting display has been developed to include a color conversion layer, which includes a color filter and a black matrix instead of a polarizing film that has a limit in bending.

Meanwhile, in the organic light emitting display having the color conversion layer applied thereto, light incident from the outside is reflected by the color filter or is reflected by a light emitting device.

SUMMARY

According to an exemplary embodiment of the present invention, a display device includes a first substrate including a pixel region and a peripheral region at least partially surrounding the pixel region and a plurality of pixels disposed in the pixel region. The plurality of pixels includes first, second and third sub-pixels each having a light emitting region. The display device further includes light emitting elements respectively disposed in the light emitting regions of the first to third sub-pixels and a color conversion layer having color filter patterns corresponding to respective light emitting elements. At least one of the color filter patterns has a size smaller than that of the light emitting elements in a first direction of the first substrate, and the rest of the color filter patterns has a size larger than that of the light emitting elements in the first direction of the first substrate.

In an exemplary embodiment of the present invention, the color filter patterns include a first color filter pattern corresponding to a red color, a second color filter pattern corresponding to a green color, and a third color filter pattern corresponding to a blue color. At least one color filter pattern of the first and second color filter patterns has a size smaller than that of a corresponding light emitting element.

In an exemplary embodiment of the present invention, the third color filter pattern has a size equal to or larger than that of a corresponding light emitting element.

In an exemplary embodiment of the present invention, the light emitting elements include: a first light emitting element corresponding to the first color filter pattern, the first light emitting element emitting light of a first color; a second light emitting element corresponding to the second color filter pattern, the second light emitting element emitting light of a second color; and a third light emitting element corresponding to the third color filter pattern, the third light emitting element emitting light of a third color.

In an exemplary embodiment of the present invention, the first light emitting element includes a first emitting layer having a size smaller than that of the first color filter pattern in the first direction of the first substrate, a first electrode disposed between the first substrate and the first emitting layer, and a second electrode disposed on the first emitting layer.

In an exemplary embodiment of the present invention, the second light emitting element includes a second emitting layer having a size smaller than that of the second color filter pattern in the first direction of the first substrate, a first electrode disposed between the first substrate and the second emitting layer, and a second electrode disposed on the second emitting layer.

In an exemplary embodiment of the present invention, the third light emitting element includes a third emitting layer having a size smaller than that of the third color filter pattern in the first direction of the first substrate, a first electrode disposed between the first substrate and the third emitting layer, and a second electrode disposed on the third emitting layer.

In an exemplary embodiment of the present invention, the display device further includes a filling layer disposed between the light emitting elements and the color conversion layer.

In an exemplary embodiment of the present invention, the filling layer includes an adhesive insulating material.

In an exemplary embodiment of the present invention, the color conversion layer is disposed on a second substrate opposite to the first substrate.

In an exemplary embodiment of the present invention, the color conversion layer further includes a black matrix disposed between the color filter patterns.

In an exemplary embodiment of the present invention, the display device further includes a plurality of thin film transistors disposed in the pixel region, the plurality of thin film transistors being connected to respective light emitting elements.

In an exemplary embodiment of the present invention, each of the plurality of thin film transistors includes an active pattern disposed on the first substrate, a gate electrode disposed on the active pattern and a source electrode and a drain electrode, each connected to the active pattern.

According to an exemplary embodiment of the present invention, a display device includes a first substrate including a pixel region and a peripheral region at least partially surrounding the pixel region and a plurality of pixels disposed in the pixel region. The plurality of pixels includes first, second and third sub-pixels. The first sub-pixel includes a first light emitting element including a first emitting layer and the second sub-pixel includes a second light emitting element including a second emitting layer. The display device further includes a color conversion layer including a first color filter pattern corresponding to the first light emitting element and a second color filter pattern corresponding to the second light emitting element. A width of the first color filter pattern is smaller than a width of the first emitting layer, and/or a width of the second color filter pattern is smaller than a width of the second emitting layer.

In an exemplary embodiment of the present invention, the width of the first color filter pattern is smaller than the width of the first emitting layer, and the width of the second color filter pattern is smaller than the width of the second emitting layer.

In an exemplary embodiment of the present invention, the color conversion layer further includes a black matrix at least partially surrounding the first color filter pattern and the second color filter pattern.

In an exemplary embodiment of the present invention, the black matrix partially overlaps the first emitting layer and the second emitting layer.

In an exemplary embodiment of the present invention, the third sub-pixel includes a third light emitting element including a third emitting layer, and the color conversion layer further includes a third color filter pattern corresponding to the third light emitting element.

In an exemplary embodiment of the present invention, a width of the third color filter pattern is equal to or larger than a width of the third emitting layer.

According to an exemplary embodiment of the present invention, a display device includes a first substrate including a display area and a non-display area and a plurality of pixels disposed in the display area. The plurality of pixels includes first, second and third sub-pixels. The first sub-pixel includes a first emitting layer, the second sub-pixel includes a second emitting layer, and the third sub-pixel includes a third emitting layer. The display device further includes a color conversion layer including a first color filter pattern corresponding to the first emitting layer, a second color filter pattern corresponding to the second emitting layer, a third color filter pattern corresponding to the third emitting layer, and a black matrix at least partially surrounding the first, second and third color filter patterns. The black matrix partially overlaps at least one of the first emitting layer or the second emitting layer, and the black matrix does not overlap the third emitting layer.

BRIEF DESCRIPTION OF THE DRAWINGS

The above and other features of the present invention will become more apparent by describing in detail exemplary embodiments thereof, with reference to the accompanying drawings, in which:

FIGS. 6 and 7 are sectional views, corresponding to the line I-I' of FIG. 3, of a pixel of a display device according to an exemplary embodiment of the present invention.

DETAILED DESCRIPTION OF THE EMBODIMENTS

Figure 1:
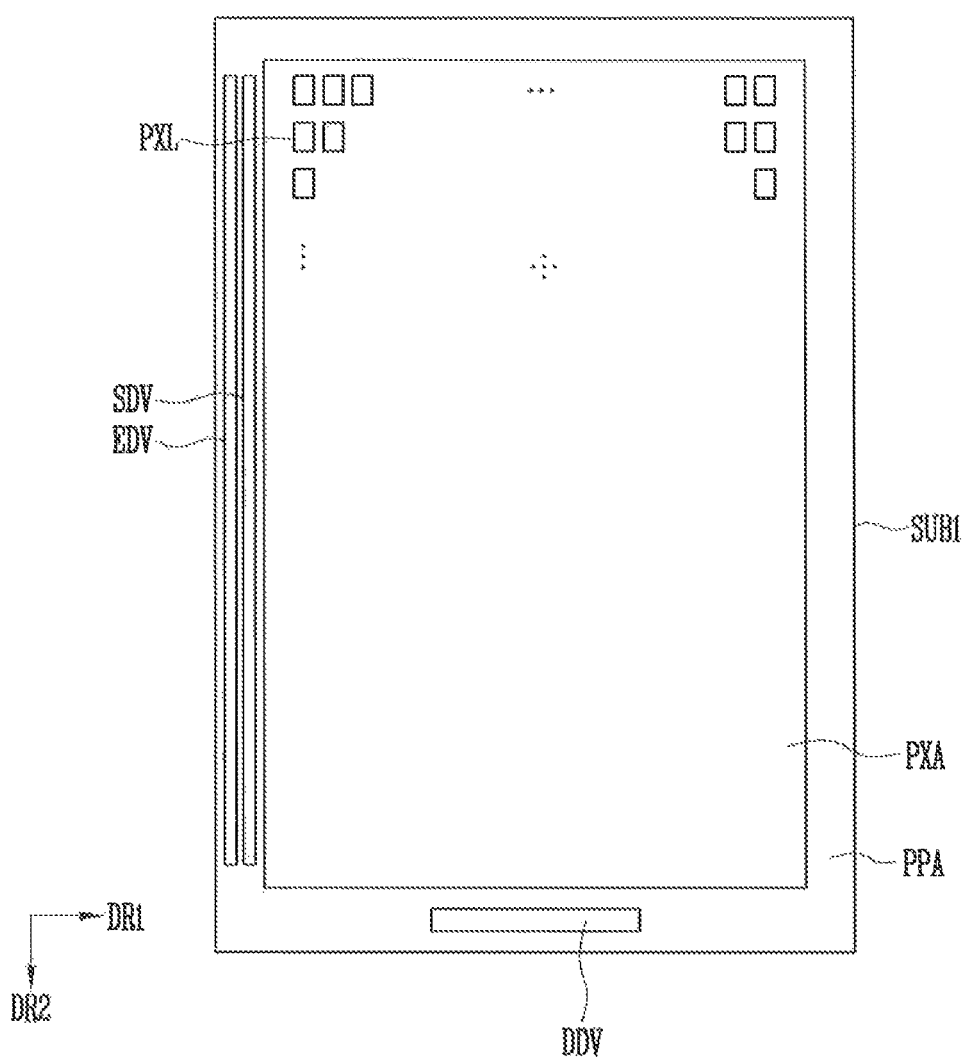
FIG. 1 is a plan view illustrating a display device according to an exemplary embodiment of the present invention.

It will be understood that an expression that an element such as a layer, region, substrate or plate is placed "on" or "above" another element indicates not only a case where the element is placed "directly on" or "just above" the other element but also a case where a further element is interposed between the element and the other element. An expression that an element such as a layer, region, substrate or plate is placed "beneath" or "below" another element indicates not only a case where the element is placed "directly beneath" or "just below" the other element but also a case where a further element is interposed between the element and the other element.

It will be understood that in the drawings, dimensions or sizes of elements may be exaggerated for clarity. It will be understood that when an element is referred to as being "between" two elements, it can be the only element between the two elements, or one or more intervening elements may also be present. Like reference numerals may refer to like elements throughout the disclosure.

Exemplary embodiments of the present invention will be described more fully hereinafter with reference to the accompanying drawings.

FIG. 1 is a plan view illustrating a display device according to an exemplary embodiment of the present invention. In FIG. 1, the display device includes first and second substrates SUB1 and SUB2 that are disposed opposite to each other.

Referring to FIG. 1, the display device according to an exemplary embodiment of the present invention may include the first substrate SUB1, pixels PXL provided on the first substrate SUB1, a driving unit that is provided on the first substrate SUB1 and drives the pixels PXL, and a line unit that connects the pixels PXL and the driving unit.

The first substrate SUB1 may include a pixel region PXA and a peripheral region PPA. The pixel region PXA may be a display area in which the pixels PXL are provided, and the pixels PXL serve to display an image. The pixels PXL will be described later. The peripheral region PPA may be a non-display area in which no image is displayed and no pixels PXL are provided.

In peripheral regions PPA, the driving unit for driving the pixels PXL and some lines that connect the pixels PXL and the driving unit may be provided. The peripheral regions PPA may correspond to a bezel in a display device, and the width of the bezel may be determined according to the width of the peripheral region PPA.

The pixel region PXA may have various shapes. For example, the pixel region PXA may be provided in various shapes such as a closed polygonal shape including linear sides, a circle or an ellipse including, for example, curved sides, and a semicircle or a semi-ellipse including, for example, linear and curved sides. When the pixel region PXA includes a plurality of regions, each region may also be provided in various shapes such as a closed polygonal shape including linear sides, a circle or an ellipse including, for example, curved sides, and a semicircle or a semi-ellipse including, for example, linear and curved sides. In addition, areas of the plurality of regions may be equal to or different from one another.

In an exemplary embodiment of the present invention the pixel region PXA may be provided as one region having a quadrangular shape including linear sides.

The peripheral region PPA may be provided at least one side of the pixel region PXA. For example, the peripheral region PPA may at least partially surround the pixel region PXA. In an exemplary embodiment of the present invention, the peripheral region PPA may surround the circumference of the pixel region PXA. In an exemplary embodiment of the present invention, the peripheral region PPA may include a lateral part extending in a first direction DR1 and a longitudinal part extending in a second direction DR2. The longitudinal part of the peripheral region PPA may be provided in a pair spaced apart from each other along the width direction (e.g. along the second direction DR2) of the pixel region PXA.

The pixels PXL may be provided in the pixel region PXA on the first substrate SUB1. Each of the pixels PXL is a unit for displaying an image, and there may be a plurality of pixels PXL. Each of the pixels PXL may include a light emitting element that emits white light and/or colored light.

The plurality of pixels PXL may be arranged in a matrix form along rows extending in the first direction DR1 and columns extending in the second direction DR2. However, the arrangement of the pixels PXL is not limited thereto, and the pixels PXL may be arranged in various forms and configurations.

The driving unit transmits signals to each pixel PXL through the line unit, and accordingly, can control driving of the pixel PXL. The line unit will be described later.

The driving unit may include a scan driver SDV that transmits a scan signal to the pixel PXL through a scan line, an emission driver EDV that transmits an emission control signal to the pixel PXL through an emission control line, a data driver DDV that transmits a data signal to the pixel PXL through a data line, and a timing controller. The timing controller may control the scan driver SDV, the emission driver EDV, and the data driver DDV.

Figure 2:
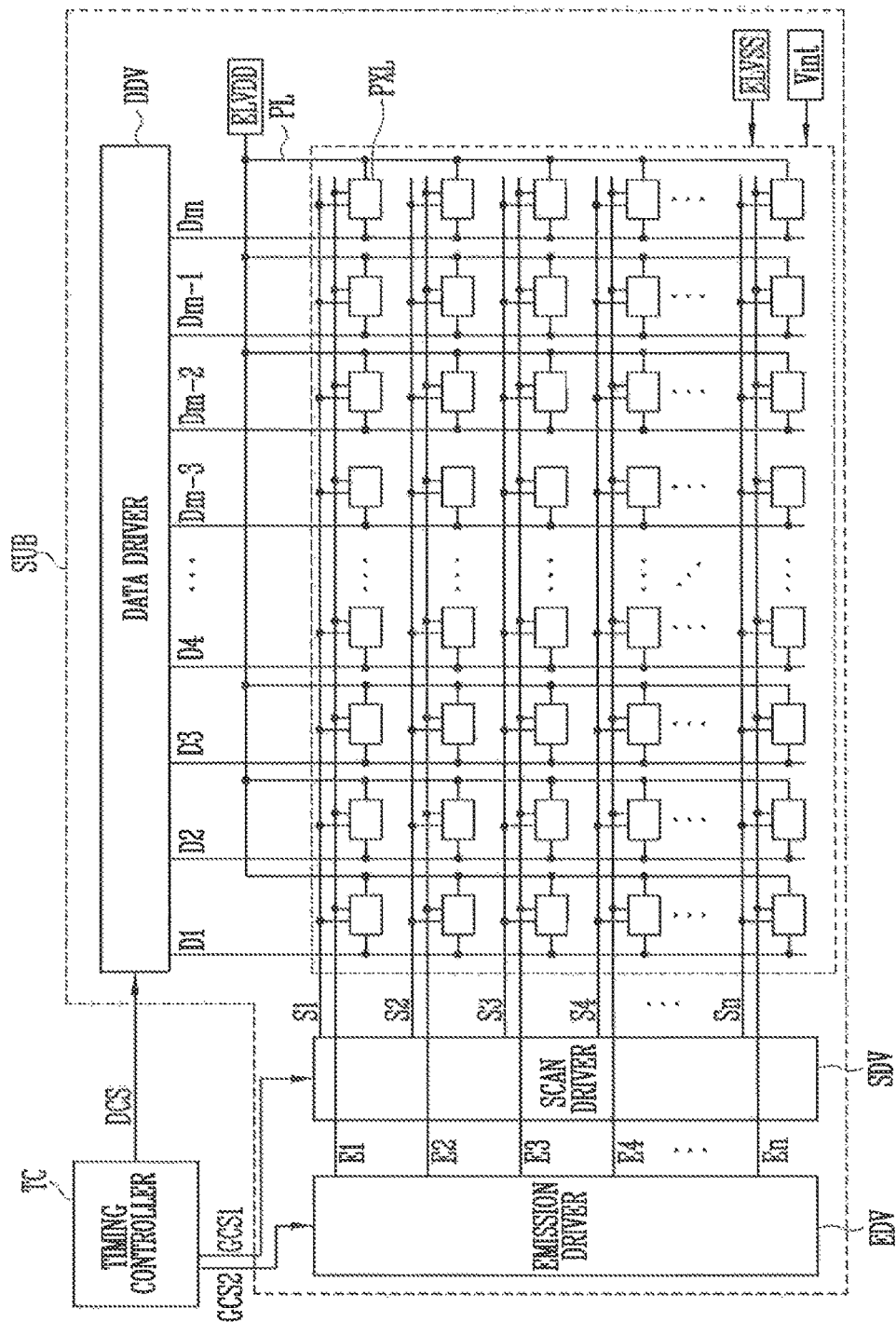
FIG. 2 is a block diagram illustrating pixels and a driving unit in the display device of FIG. 1 according to an exemplary embodiment of the present invention.

FIG. 2 is a block diagram illustrating the pixels PXL and the driving unit in the display device of FIG. 1 according to an exemplary embodiment of the present invention.

Referring to FIGS. 1 and 2, the display device according to an exemplary embodiment of the present invention may include pixels PXL, a driving unit, and a line unit.

The pixels PXL may be provided in plural. The drive unit may include a scan driver SDV, an emission driver EDV, a data driver DDV, and a timing controller TC. In FIG. 2, positions of the scan driver SDV, the emission driver EDV, the data driver DDV, and the timing controller TC are set for convenience of description, and the present invention is not limited thereto. For example, when an actual display device, according to an exemplary embodiment of the present invention, is implemented, the scan driver SDV, the emission driver EDV, the data driver DDV, and the timing controller TC may be disposed at other positions in the display device.

The line unit applies signals from the drive unit to each pixel PXL, and the line unit may include scan lines, data lines, emission control lines, a power line PL, and an initialization power line. The scan lines may include a plurality of scan lines S1 to Sn, and the emission control lines may include a plurality of emission control lines E1 to En. The data lines may include a plurality of data lines D1 to Dm. The data lines D1 to Dm and the power line PL may be connected to the pixels PXL.

The pixels PXL may be arranged in a pixel region PXA. The pixels PXL may be connected to the scan lines S1 to Sn, the emission control lines E1 to En, the data lines D1 to Dm, and the power line PL. The pixels PXL may be supplied with a data signal from the data lines D1 to Dm when a scan signal is supplied from the scan lines S1 to Sn.

In addition, the pixels PXL may be supplied with a first power source ELVDD, a second power source ELVSS, and an initialization power source Vint from the outside. Here, the first power source ELVDD may be applied through the power line PL.

Each of the pixels PXL may include a driving transistor and a light emitting element. The driving transistor may control the amount of current flowing from the first power source ELVDD to the second power source ELVSS via the light emitting element, corresponding to the data signal. Here, before the data signal is supplied, a gate electrode of the driving transistor may be initialized by the voltage of the initialization power source Vint. In addition, the initialization power source Vint may be set to a voltage lower than that of the data signal.

The scan driver SDV may transmit the scan signal to the scan lines S1 to Sn in response to a first gate control signal GCS1 from the timing controller TC. For example, the scan driver SDV may sequentially transmit the scan signal to the scan lines S1 to Sn. If the scan signal is sequentially supplied to the scan lines S1 to Sn, the pixels PXL may be sequentially selected in units of horizontal lines.

The emission driver EDV may transmit the emission control signal to the emission control lines E1 to En in response to a second gate control signal GCS2 from the timing controller TC. For example, the emission driver EDV may sequentially transmit the emission control signal to the emission control lines E1 to En.

The data driver DDV may transmit the data signal to the data lines D1 to Dm in response to a data control signal DCS. The data signal supplied to the data lines D1 to Dm may be supplied to pixels PXL selected by the scan signal.

The timing controller TC may transmit, to the scan driver SDV and the emission driver EDV, the gate control signals GCS1 and GCS2 generated based on timing signals supplied from the outside (e.g., an external device). In addition, the timing controller TC may transmit the data control signal DCS to the data driver DDV.

A start pulse and clock signals may be included in each of the gate control signals GCS1 and GCS2. The start pulse may control a timing of a first scan signal or a first light emitting control signal. The clock signals may be used to shift the start pulse.

A source start pulse and clock signals may be included in the data control signal DCS. The source start pulse may control a sampling start time of data. The clock signals may be used to control a sampling operation.

Figure 3:
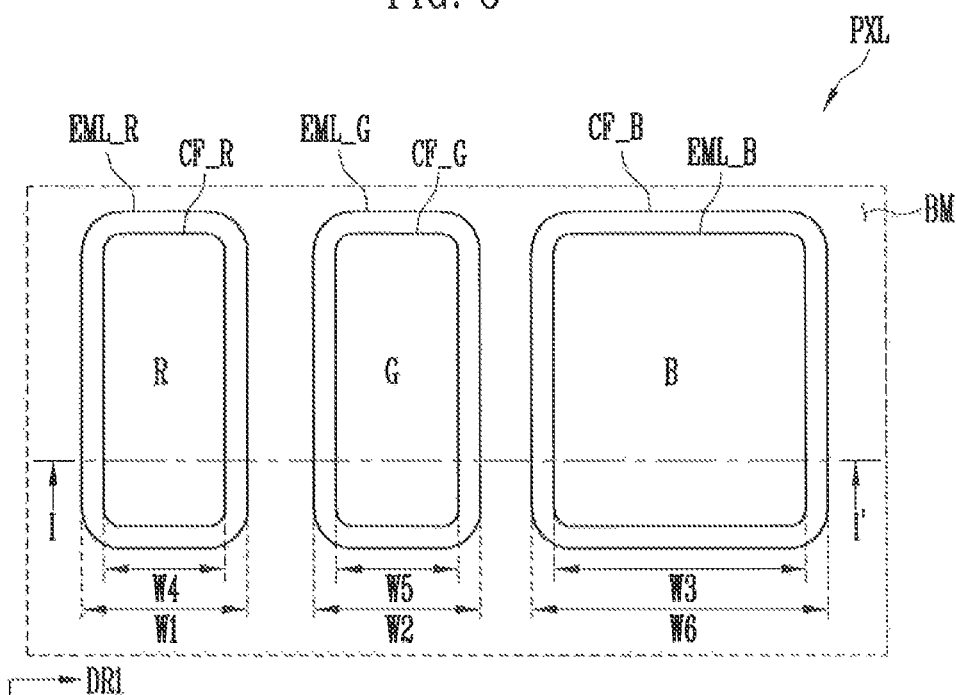
FIGS. 3 and 4 are plan views illustrating one pixel among the pixels shown in FIG. 1 according to an exemplary embodiment of the present invention.
Figure 4:
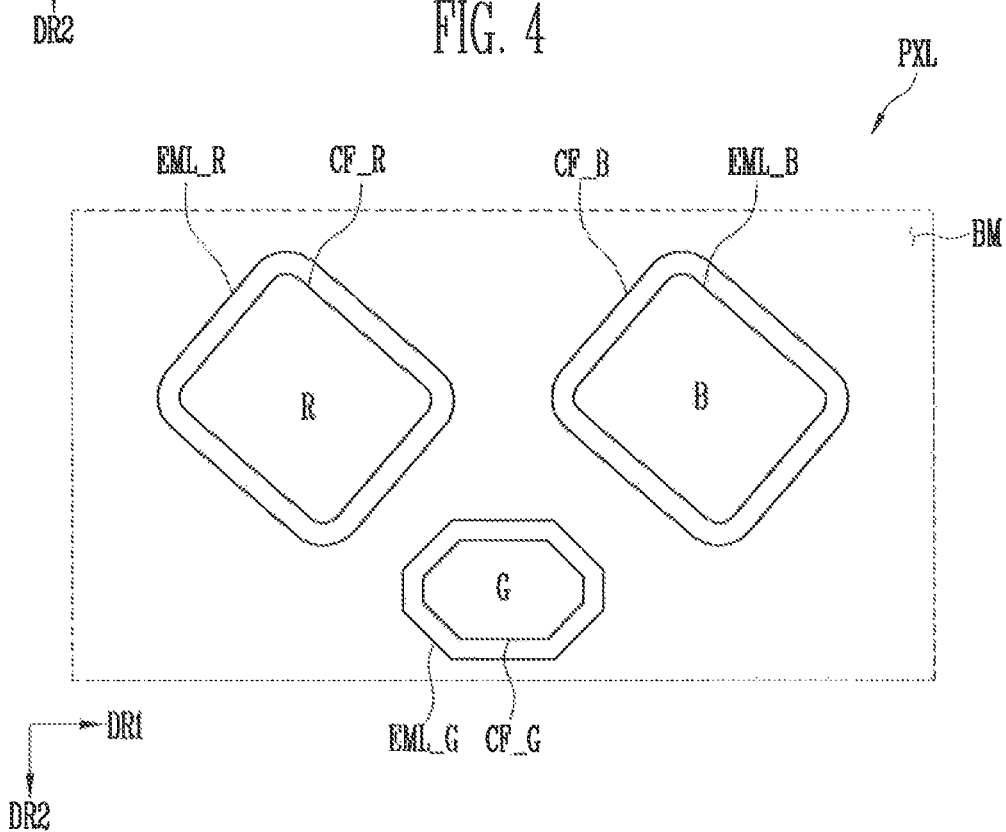

FIGS. 3 and 4 are plan views illustrating one pixel among the pixels shown in FIG. 1 according to an exemplary embodiment of the present invention. For convenience of description, the one pixel is illustrated in FIGS. 3 and 4 to include an emitting layer and a color filter pattern, which implements light, and a black matrix surrounding the circumference of the emitting layer and the color filter pattern.

Referring to FIGS. 1, 3, and 4, the pixel PXL according to an exemplary embodiment of the present invention may include a first sub-pixel R, a second sub-pixel G, and a third sub-pixel B. Further, the first and second sub-pixels R and G have a size different from that of the third sub-pixel B, but the present invention is not limited thereto. For example, all of the first to third sub-pixels R, G, and B may be provided to have sizes equal to or different from one another. In addition, each of the first to third sub-pixels R, G, and B may have a polygonal shape, but the present invention is not limited thereto. For example, each of the first to third sub-pixels R, G, and B may have various shapes such as a circular shape, an elliptical shape, or a semi-elliptical shape.

The first sub-pixel R may include a first emitting layer EML_R and a first color filter pattern CF_R. The first emitting layer EML_R may correspond to (e.g., overlap with) a light emitting region of the first sub-pixel R, and a black matrix BM disposed at the outside of the first color filter pattern CF_R may correspond to a non-light emitting region of the first sub-pixel R. For example, the first emitting layer EML_R may be provided in the light emitting region of the first sub-pixel R, and the black matrix BM may be provided in a non-light emitting region of the first sub-pixel R. As an additional example, the black matrix BM may at least partially surround the first color filter pattern CF_R.

When viewed on a plane, the first emitting layer EML_R and the first color filter pattern CF_R may overlap with each other. In addition, the first emitting layer EML_R may have a first width W1 in a first direction DR1 of the first substrate SUB1, and the first color filter pattern CF_R may have a fourth width W4 in the first direction DR1 of the first substrate SUB1. The first width W1 may be wider than the fourth width W4. Therefore, when viewed on a plane, the first emitting layer EML_R may have a size larger than that of the first color filter pattern CF_R.

The second sub-pixel G may include a second emitting layer EML_G and a second color filter pattern CF_G. The second emitting layer EML_G may correspond to a light emitting region of the second sub-pixel G, and the black matrix BM disposed at the outside of the second color filter pattern CF_G may correspond to a non-light emitting region of the second sub-pixel G.

When viewed on a plane, the second emitting layer EML_G and the second color filter pattern CF_G may overlap with each other. In addition, the second emitting layer EML_G may have a second width W2 in the first direction DR1 of the first substrate SUB1, and the second color filter pattern CF_G may have a fifth width W5 in the first direction DR1 of the first substrate SUB1. The second width W2 may be wider than the fifth width W5. Therefore, when viewed on a plane, the second emitting layer EML_G may have a size larger than that of the second color filter pattern CF_G.

The third sub-pixel B may include a third emitting layer EML_B and a third color filter pattern CF_B. The third emitting layer EML_B may correspond to a light emitting region of the third sub-pixel B, and the black matrix BM disposed at the outside of the third color filter pattern CF_B may correspond to a non-light emitting region of the third sub-pixel B.

When viewed on a plane, the third emitting layer EML_B and the third color filter pattern CF_B may overlap with each other. In addition, the third emitting layer EML_B may have a third width W3 in the first direction DR1 of the first substrate SUB1, and the third color filter pattern CF_B may have a sixth width W6 in the first direction DR1 of the first substrate SUB1. The sixth width W6 may be wider than the third width W3. Therefore, when viewed on a plane, the third color filter pattern CF_B may have a size larger than that of the third emitting layer EML_B. However, the present invention is not limited thereto. For example, in an exemplary embodiment of the present invention, the third color filter pattern CF_B may have a size smaller than the third emitting layer EML_B.

In an exemplary embodiment of the present invention, it is illustrated that the first to third sub-pixels R, G, and B are disposed adjacent to one another along a second direction DR2 of the first substrate SUB1 and are arranged on the same row, but the present invention is not limited thereto. In an exemplary embodiment of the present invention, as shown in FIG. 4, the first and third sub-pixels R and B and the second sub-pixel G may be arranged on different rows.

In an exemplary embodiment of the present invention, the first to third sub-pixels R, G, and B may have different shapes from one another. For example, the first and third sub-pixels R and B may each have a quadrilateral shape, and the second sub-pixel G may have an octagonal shape. However, the present invention is not limited thereto.

Figure 5:
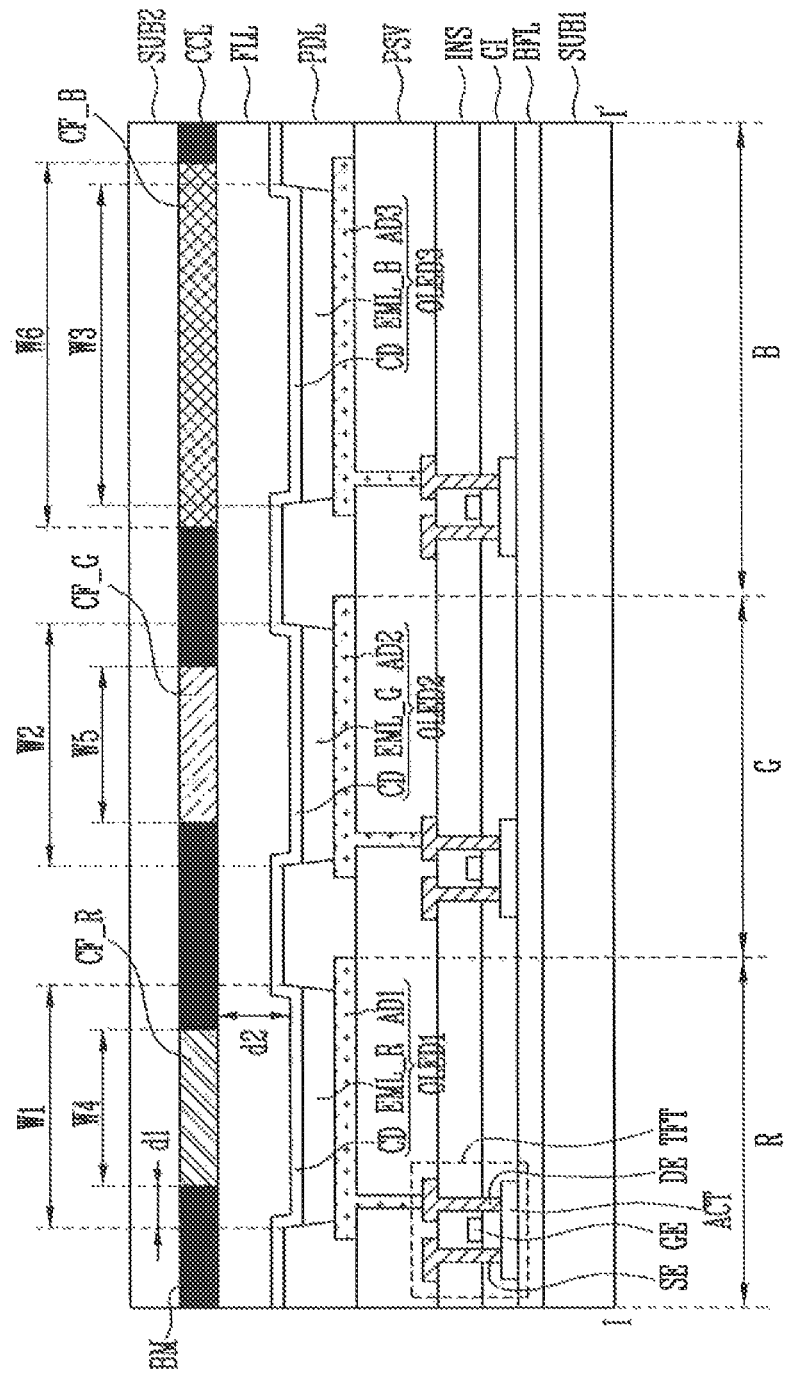
FIG. 5 is a sectional view taken along line I-I' of FIG. 3 according to an exemplary embodiment of the present invention.

FIG. 5 is a sectional view taken along line I-I' of FIG. 3 according to an exemplary embodiment of the present invention. FIG. 5 illustrates a display device according to an exemplary embodiment of the present invention, in which some components may be exaggerated or reduced for clarity.

Referring to FIGS. 3 and 5, the display device, according to an exemplary embodiment of the present invention, includes a first substrate SUB1 and thin film transistors TFT provided on the first substrate SUB1. A second substrate SUB2 is disposed opposite to the first substrate SUB1. A color conversion layer CCL is disposed on the second substrate SUB2.

The first substrate SUB1 may be made of an insulative material such as glass or resin. In addition, the first substrate SUB1 may be made of a material having flexibility or elasticity to be bendable or foldable. The first substrate SUB1 may have a single-layered structure or a multi-layered structure.

For example, the first substrate SUB1 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material constituting the first substrate SUB1 may be variously changed, and the first substrate SUB1 may be made of fiber glass reinforced plastic (FRP), etc.

A buffer layer BFL may be disposed on the first substrate SUB1. The buffer layer BFL may prevent impurities from being diffused into the thin film transistors TFT provided on the first substrate SUB1. The buffer layer BFL may be provided in a single layer or may be provided as a multi-layer structure including at least two layers.

Active patterns ACT may be disposed on the buffer layer BFL. The active patterns ACT may be formed of a semiconductor material. Each of the active patterns ACT may include a source region, a drain region, and a channel region provided between the source region and the drain region. The active pattern ACT may be a semiconductor pattern made of, for example, poly-silicon, amorphous silicon, an oxide semiconductor, etc. The channel region is a semiconductor pattern undoped with impurities, and may be an intrinsic semiconductor. The source region and the drain region may be semiconductor patterns doped with impurities.

A gate insulating layer GI may be disposed on the buffer layer BFL having the active pattern ACT provided thereon. The gate insulating layer GI may be an inorganic insulating layer including an inorganic material or an organic insulating layer including an organic material.

A gate electrode GE may be disposed on the gate insulating layer GI. The gate electrode GE may be formed to cover a region corresponding to the channel region of the active pattern ACT. The gate electrode GE may be made of a metal. For example, the gate electrode GE may be made of at least one metal such as gold (Au), silver (Ag), aluminum (Al), molybdenum (Mo), chromium (Cr), titanium (Ti), nickel (Ni), neodymium (Nd), and copper (Cu), or alloys thereof. In addition, the gate electrode GE may be formed in a single layer, but the present invention is not limited thereto. For example, the gate electrode GE may be formed as a multi-layered structure in which two or more materials among the metals and the alloys are stacked. In an exemplary embodiment of the present invention, a gate line that supplies a scan signal to the thin film transistor TFT may be provided in the same layer as the gate electrode GE and include the same material.

An insulating layer INS is disposed on the gate insulating layer GI having the gate electrode GE provided thereon. The insulating layer INS may be an inorganic insulating layer including an inorganic material. The inorganic material may include, for example, polysiloxane, silicon nitride, silicon oxide, silicon oxynitride, and the like.

A source electrode SE and a drain electrode DE may be disposed on the insulating layer INS. The source electrode SE and the drain electrode DE may be connected to the source region and the drain region of the active pattern ACT through contact holes sequentially passing through the insulating layer INS and the gate insulating layer GI, respectively. The source electrode SE and the drain electrode DE may be made of a metal. For example, the source electrode SE and the drain electrode DE may be made of gold (Au), silver (Ag), aluminum (Al), molybdenum (Mo), chromium (Cr), titanium (Ti), nickel (Ni), neodymium (Nd), and copper (Cu), and/or alloys thereof. In addition, the source electrode SE and the drain electrode DE may be formed in a single layer, but the present invention is not limited thereto. For example, the source electrode SE and the drain electrode DE may be formed as a multi-layer structure in which two or more materials among the metals and the alloys are stacked.

In an exemplary embodiment of the present invention, each of the thin film transistors TFT of the display device may include the active pattern ACT, the gate electrode GE, the source electrode SE, and the drain electrode DE. A case where each of the thin film transistors TFT is a thin film transistor having a top gate structure is illustrated as an example, but the present invention is not limited thereto. For example, each of the thin film transistors TFT may be a thin film transistor having a bottom gate structure.

A passivation layer PSV that covers the thin film transistor TFT may be disposed on the insulating layer INS on which the source electrode SE and the drain electrode DE are provided. The passivation layer PSV may be an organic insulating layer including an organic material. Examples of the organic material may be organic insulating materials including, for example, a polyacryl-based compound, a polyimide-based compound, a fluorine-based compound such as Teflon, a benzocyclobutene-based compound, and the like.

First to third light emitting elements OLED1, OLED2, and OLED3 may be disposed on the passivation layer PSV.

The first light emitting element OLED1 may include a (1-1)th electrode AD1, a first emitting layer EML_R, and a second electrode CD. The second light emitting element OLED2 may include a (1-2)th electrode AD2, a second emitting layer EML_G, and the second electrode CD. The third light emitting element OLED3 may include a (1-3)th electrode AD3, a third emitting layer EML_B, and the second electrode CD. Here, the (1-1)th electrode AD1, the (1-2)th electrode AD2, and the (1-3)th electrode AD3 may be provided in the same layer and may include the same material.

The (1-1)th electrode AD1, the (1-2)th electrode AD2, and the (1-3)th electrode AD3 may be disposed on the passivation layer PSV. Each of the (1-1)th electrode AD1, the (1-2)th electrode AD2, and the (1-3)th electrode AD3 may be connected to the drain electrode DE of a corresponding thin film transistor TFT through a contact hole passing through the passivation layer PSV.

A pixel defining layer PDL may be disposed on the passivation layer PSV on which the (1-1)th electrode AD1, the (1-2)th electrode AD2, and the (1-3)th electrode AD3 are provided. The pixel defining layer PDL may allow a region corresponding to the light emitting region of each of the sub-pixels R, G, and B to be exposed therethrough. For example, the pixel defining layer PDL may allow a top surface of each of the (1-1)th electrode AD1, the (1-2)th electrode AD2, and the (1-3)th electrode AD3 to be exposed therethrough, and protrude from the passivation layer PSV along the circumference of each of the sub-pixels R, G, and B.

The first emitting layer EML_R may be disposed on the (1-1)th electrode AD1 exposed by the pixel defining layer PDL, and the second electrode CD may be disposed on the first emitting layer EML_R. For example, the first emitting layer EML_R may be disposed on the exposed portion of the (1-1)th electrode AD1. In addition, the second emitting layer EML_G may be disposed on the (1-2)th electrode AD2 exposed by the pixel defining layer PDL, and the second electrode CD may be disposed on the second emitting layer EML_G. In addition, the third emitting layer EML_B may be disposed on the (1-3)th electrode AD3 exposed by the pixel defining layer PDL, and the second electrode CD may be disposed on the third emitting layer EML_B.

Each of the (1-1)th electrode AD1, the (1-2)th electrode AD2, and the (1-3)th electrode AD3 may be an anode electrode, and the second electrode CD may be a cathode electrode. In addition, when each of the first to third light emitting elements OLED1, OLED2, and OLED3 is a top-emission light emitting element, each of the (1-1)th electrode AD1, the (1-2)th electrode AD2, and the (1-3)th electrode AD3 may be a reflective electrode, and the second electrode CD may be a transmissive electrode.

As described above, when each of the (1-1)th electrode AD1, the (1-2)th electrode AD2, and the (1-3)th electrode AD3 is the anode electrode and is the reflective electrode, each of the (1-1)th electrode AD1, the (1-2)th electrode AD2, and the (1-3)th electrode AD3 may include a reflective layer and a transparent conductive layer disposed on the top or bottom of the reflective layer. At least one of the transparent conductive layer and the reflective layer may be connected to the drain electrode DE of a corresponding thin film transistor TFT.

The reflective layer may include a material that reflects light. For example, the reflective layer may include at least one of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include a transparent conductive oxide such as indium tin oxide (ITO), indium zinc oxide (IZO), aluminum zinc oxide (AZO), gallium doped zinc oxide (GZO), zinc tin oxide (ZTO), gallium tin oxide (GTO), and/or fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and/or silane based resin.

The first emitting layer EML_R may have a multi-layered thin film structure including a light generation layer that generates light of a red color or a white color. The second emitting layer EML_G may have a multi-layered thin film structure including a light generation layer that generates light of a green color or a white color. The third emitting layer EML_B may have a multi-layered thin film structure including a light generation layer that generates light of a blue color or white color.

When viewed on a plane, a width W1 (hereinafter, referred to as a "first width") of the first emitting layer EML_R in a first direction DR1 of the first substrate SUB1 may be substantially equal to a width W2 (hereinafter, referred to as a "second width") of the second emitting layer EML_G in the first direction DR1 of the first substrate SUB1. In addition, a width W3 (hereinafter, referred to as a "third width") of the third emitting layer EML_B in the first direction DR1 of the first substrate SUB1 may be wider than the first and second widths W1 and W2 in the first direction DR1 of the first substrate SUB1.

A filling layer FLL that covers the second electrode CD may be disposed on the second electrode CD. The filling layer FLL may be made of an insulating material, and include an adhesive material for allowing the second substrate SUB2 to be adhered to the first substrate SUB1. In addition, the filling layer FLL may be an encapsulating member that prevents oxygen and moisture from penetrating into the first to third light emitting elements OLED1, OLED2, and OLED3.

The second substrate SUB2 opposite to the first substrate SUB1 may be disposed on the filling layer FLL. The second substrate SUB2 may include the same material as the first substrate SUB1, but the present invention is not limited thereto. For example, the second substrate SUB2 may include material different from that of the first substrate SUB1.

The color conversion layer CCL may be disposed between the filling layer FLL and the second substrate SUB2. The color conversion layer CCL may include first to third color filter patterns CF_R, CF_G, and CF_B that each emits light of a specific color for each sub-pixel R, G, or B. In addition, the color conversion layer CCL may include a black matrix BM provided between the first to third color filter patterns CF_R, CF_G, and CF_B. For example, the black matrix BM may be provided between the first and second color filter patterns CF_R and CF_G and between the second and third color filter patterns CF_G and CF_B. Here, the first to third color filter patterns CF_R, CF_G, and CF_B may have different sizes in one direction of the second substrate SUB2.

The first color filter pattern CF_R may correspond to the first emitting layer EML_R and may convert the color of light emitted from the first emitting layer EML_R into light of a first color. The first color filter pattern CF_R may have a fourth width W4 in the first direction DR1 of the first substrate SUB1. When viewed on a plane, the first width W1 may be wider than the fourth width W4. Therefore, the first emitting layer EML_R may have a size larger than that of the first color filter pattern CF_R.

The second color filter pattern CF_G may correspond to the second emitting layer EML_G and may convert the color of light emitted from the second emitting layer EML_G into light of a second color. The second color filter pattern CF_G may have a fifth width W5 in the first direction DR1 of the first substrate SUB1. When viewed on a plane, the second width W2 may be wider than the fifth width W5. Therefore, the second emitting layer EML_G may have a size larger than that of the second color filter pattern CF_G.

In an exemplary embodiment of the present invention, the fourth width W4 and the fifth width W5 may be substantially the same. However, the present invention is not limited thereto.

The third color filter pattern CF_B may correspond to the third emitting layer EML_B and convert the color of light emitted from the third emitting layer EML_B into light of a third color. The third color filter pattern CF_B may have a sixth width W6 in the first direction DR1 of the first substrate SUB1. When viewed on a plane, the third width W3 may be smaller than the sixth width W6. Therefore, the third emitting layer EML_B may have a size smaller than that of the third color filter pattern CF_B.

In an exemplary embodiment of the present invention, the first color may be red, the second color may be green, and the third color may be blue, but the present invention is not limited thereto. For example, the first color may be green, the second color may be red, and the third color may be blue.

In the display device according to an exemplary embodiment of the present invention, the pixel PXL including the first to third sub-pixels R, G, and B may be provided in plurality.

The first sub-pixel R may include the first light emitting element OLED1, the thin film transistor TFT connected to the first light emitting element OLED1, and the first color filter pattern CF_R corresponding to the first light emitting element OLED1.

As described above, in the first sub-pixel R, the first color filter pattern CF_R has a size smaller than that of the first emitting layer EML_R, and hence a size of the black matrix BM surrounding the edge of the first color filter pattern CF_R may relatively increase. For example, the black matrix BM may partially overlap the (1-1)th electrode AD1, the first emitting layer EML_R, and the second electrode CD. Therefore, although light introduced from the outside is reflected by the first light emitting element OLED1, a portion of the light is absorbed by the black matrix BM, and hence the external light reflectance of the first sub-pixel R may be decreased.

In addition, a distance d1 (hereinafter, referred to as a "first distance") between an end of the first color filter pattern CF_R and an end of the first emitting layer EML_R may be a minimum of 0 (μm) to a maximum of $$\frac{d_2}{n} \frac{1}{\cos(\sin^{-1}(1/n))} (\mu m).$$

Here, n may be a refractive index of the filling layer FLL, d2 may be a distance (hereinafter, referred to as a "second distance") between the first light emitting element OLED1 and the first color filter pattern CF_R in a longitudinal direction of the first substrate SUB1.

The minimum value of the first distance d1 may be a case where the first color filter pattern CF_R and the first emitting layer EML_R have the same size. The maximum value of the first distance d1 may be a value set within a range in which the light reflected by the first light emitting element OLED1 is blocked by the black matrix BM such that the luminance of the first sub-pixel R is not decreased. Therefore, the first distance d1 may be determined by the refractive index of the filling layer FLL and the second distance d2.

The second sub-pixel G may include the second light emitting element OLED2, the thin film transistor TFT connected to the second light emitting element OLED, and the second color filter pattern CF_G corresponding to the second light emitting element OLED2.

As described above, in the second sub-pixel G, the second color filter pattern CF_G has a size smaller than that of the second emitting layer EML_G, and hence a size of the black matrix BM surrounding the edge of the second color filter pattern CF_G may relatively increase. For example, the black matrix BM may partially overlap the (1-2)th electrode AD2, the second emitting layer EML_G, and the second electrode CD. Therefore, although light introduced from the outside is reflected by the second light emitting element OLED2, a portion of the light is absorbed by the black matrix BM, and hence the external light reflectance of the second sub-pixel G may be decreased. A distance between an end of the second color filter pattern CF_G and an end of the second emitting layer EML_G may be equal to the first distance d1 of the first sub-pixel R, and therefore, a description of the distance between the end of the second color filter pattern CF_G and the end of the second emitting layer EML_G may be omitted.

The third sub-pixel B may include the third light emitting element OLED3, the thin film transistor TFT connected to the third light emitting element OLED3, and the third color filter pattern CF_B corresponding to the third light emitting element OLED3.

As described above, in the third sub-pixel B, the third color filter pattern CF_B has a size larger than that of the third emitting layer EML_B, and hence a size of the black matrix BM surrounding the edge of the third color filter pattern CF_B may be relatively small as compared with the first and second sub-pixels R and G. For example, the black matrix BM might not overlap the (1-3)th electrode AD3, the third emitting layer EML_B, and the second electrode CD. However, the present invention is not limited thereto. Therefore, as light introduced from the outside is reflected by the third light emitting element OLED3, the light is not blocked by the black matrix BM, and may be transmitted through the second substrate SUB2. In this case, the light transmitted through the second substrate SUB2 is light converted into blue light by the third color filter pattern CF_B, and therefore, the transmitted light may have no influence on the external light reflectance of the third sub-pixel B.

As described above, in the display device according to an exemplary embodiment of the present invention, the sizes of the first and second color filter patterns CF_R and CF_G are designed to be smaller than those of the first and second emitting layers EML_R and EML_G, so that the reflectance of light introduced from the outside can be decreased.

In addition, as the sizes of the black matrix BM in the first and second sub-pixels R and G relatively increase, the rate of the non-light emitting region of each of the first and second sub-pixels R and B may increase. In this case, the ratio of the non-light emitting region can be decreased through a design of increasing the area of each of the first and second sub-pixels R and G or changing the shape of each of the first and second sub-pixels R and G.

FIGS. 6 and 7 are sectional views, corresponding to the line I-I' of FIG. 3, of a pixel of a display device according to an exemplary embodiment of the present invention. In the display device including the pixel implemented according to an exemplary embodiment of the present invention, differences from the display device according to the above-described embodiment will be mainly described to avoid redundancy. Portions of a display device not particularly described in the present exemplary embodiment of the present invention are similar to those of the display device according to above-described exemplary embodiments of the present invention. In addition, identical reference numerals refer to identical components, and similar reference numerals refer to similar components.

First, referring to FIGS. 3 and 6, the display device according to an exemplary embodiment of the present invention may include a first substrate SUB1 including first to third sub-pixels R, G, and B, thin film transistors TFT disposed on the first substrate SUB1, a second substrate SUB2 opposite to the first substrate SUB1, and a color conversion layer CCL disposed on the second substrate SUB2.

In addition, the display device according to an exemplary embodiment of the present invention may include a first light emitting element OLED1 provided in the first sub-pixel R, a second light emitting element OLED2 provided in the second sub-pixel G, and a third light emitting element OLED3 provided in the third sub-pixel B.

The first light emitting element OLED1 may include a (1-1)th electrode AD1, a first emitting layer EML_R, and a second electrode CD. The second light emitting element OLED2 may include a (1-2)th electrode AD2, a second emitting layer EML_G, and the second electrode CD. The third light emitting element OLED3 may include a (1-3)th electrode AD3, a third emitting layer EML_B, and the second electrode CD. The (1-1)th electrode AD1, the (1-2)th electrode AD2, and the (1-3)th electrode AD3 may be provided in the same layer and may include the same material.

When viewed on a plane, a width W1 (hereinafter, referred to as a "first width") of the first emitting layer EML_R in the first direction (see DR1 of FIG. 3) of the first substrate SUB1 may be equal to a width W2 (hereinafter, referred to as a "second width") of the second emitting layer EML_G in the first direction DR1 of the first substrate SUB1. In addition, a width W3 (hereinafter, referred to as a "third width") of the third emitting layer EML_B in the first direction DR1 of the first substrate SUB1 may be wider than the first and second widths W and W2 in the first direction DR1 of the first substrate SUB1.

A filling layer FLL may be provided over the first to third light emitting elements OLED1, OLED2, and OLED3. The filling layer FLL may prevent oxygen, moisture and other impurities from penetrating into the first to third light emitting elements OLED1, OLED2, and OLED3, and may allow the second substrate SUB2 to be adhered to the first substrate SUB1.

The color conversion layer CCL may include first to third color filter patterns CF_R, CF_G, and CF_B that each emits light of a specific color for each sub-pixel R, G, or B, and a black matrix BM provided between the first to third color filter patterns CF_R, CF_G, and CF_B.

The first color filter pattern CF_R may correspond to the first emitting layer EML_R and convert the color of light emitted from the first emitting layer EML_R into light of a red color. The first color filter pattern CF_R may have a fourth width W4 in the first direction DR1 of the first substrate SUB1. The fourth width W4 may be wider than the first width W1. Therefore, the first color filter pattern CF_R may have a size larger than that of the first emitting layer EML_R.

The second color filter pattern CF_G may correspond to the second emitting layer EML_G and convert the color of light emitted from the second emitting layer EML_G into light of a green color. The second color filter pattern CF_G may have a fifth width W5 in the first direction DR1 of the first substrate SUB1. The second width W2 may be wider than the fifth width W5. Therefore, the second emitting layer EML_G may have a size larger than that of the second color filter pattern CF_G.

The third color filter pattern CF_B may correspond to the third emitting layer EML_B and convert the color of light emitted from the third emitting layer EML_B into light of a blue color. The third color filter pattern CF_B may have a sixth width W6 in the first direction DR1 of the first substrate SUB1. The third width W3 may be narrower than the sixth width W6. Therefore, the third emitting layer EML_B may have a size smaller than that of the third color filter pattern CF_B.

In an exemplary embodiment of the present invention, the first sub-pixel R may include the first light emitting element OLED1, the thin film transistor TFT connected to the first light emitting element OLED1, and the first color filter pattern CF_R corresponding to the first light emitting element OLED1. The second sub-pixel G may include the second light emitting element OLED2, the thin film transistor TFT connected to the second light emitting element OLED2, and the second color filter pattern CF_G corresponding to the second light emitting element OLED2. The third sub-pixel B may include the third light emitting element OLED3, the thin film transistor TFT connected to the third light emitting element OLED3, and the third color filter pattern CF_B corresponding to the third light emitting element OLED3.

As described above, in the second sub-pixel G, the second color filter pattern CF_G has a size smaller than that of the second emitting layer EML_G, and hence a size of the black matrix BM surrounding the edge of the second color filter pattern CF_G may relatively increase. For example, the black matrix BM surrounding the edge of the second color filter pattern CF_G may partially overlap the second light emitting element OLED2. Therefore, although light introduced from the outside is reflected by the second light emitting element OLED2, a portion of the reflected light is absorbed by the black matrix BM, and hence the external light reflectance of the second sub-pixel G may be decreased.

In addition, a distance d1 (hereinafter, referred to as a "first distance") between an end of the second color filter pattern CF_G and an end of the second emitting layer EML_G may be a minimum of 0 (μm) to a maximum of $$\frac{d_2}{n} \frac{1}{\cos(\sin^{-1}(1/n))} \text{ (μm)}.$$

Here, n may be a refractive index of the filling layer FLL, d2 may be a distance (hereinafter, referred to as a "second distance") between the second light emitting element OLED2 and the second color filter pattern CF_G in a longitudinal direction of the first substrate SUB1.

The minimum value of the first distance d1 may be a case where the second color filter pattern CF_G and the second emitting layer EML_G have the same size. The maximum value of the first distance d1 may be a value set within a range in which the light reflected by the second light emitting element OLED2 is blocked by the black matrix BM such that the luminance of the second sub-pixel G is not decreased. Therefore, the first distance d1 may be determined by the refractive index of the filling layer FLL and the second distance d2.

In addition, in an exemplary embodiment of the present invention, as shown in FIG. 7, the second color filter pattern CF_G may have a size larger than that of the second emitting layer EML_G. In addition, as shown in FIG. 7, the first color filter patter CF_R may have a size smaller than that of the first emitting layer EML_R. In this case, a size of the black matrix BM surrounding the edge of the first color filter pattern CF_R in the first sub-pixel R may relatively increase. Therefore, although light introduced from the outside is reflected by the first light emitting element OLED1, a portion of the reflected light is absorbed into the black matrix BM, and hence the external light reflectance of the first sub-pixel R may be decreased.

The display device, according to an exemplary embodiment of the present invention, can be employed in various electronic devices. For example, the display device may be applicable to televisions, notebook computers, cellular phones, smart phones, smart pads, portable media players (PMPs), personal digital assistances (PDAs), navigations devices, various wearable devices such as smart watches, and the like.

According to the present invention, it is possible to provide a display device capable of reducing the reflectance of external light.

While the present invention has been described with reference to exemplary embodiments thereof, it will be understood by those of ordinary skill in the art that various changes in form and details may be made thereto without departing from the spirit and scope of the present invention.

What is claimed is:

1. A display device comprising:
   a first substrate including a pixel region and a peripheral region at least partially surrounding the pixel region;
   a plurality of pixels disposed in the pixel region, the plurality of pixels including first, second and third sub-pixels each having a light emitting region;
   light emitting elements respectively disposed in the light emitting regions of the first to third sub-pixels and including a first light emitting element disposed in the light emitting region of the first sub-pixel, wherein the first light emitting element includes a first electrode disposed on the first substrate, a first emitting, layer disposed directly on the first electrode, and a second electrode disposed on the first emitting layer; and
   a color conversion layer having color filter patterns corresponding to respective light emitting elements, wherein the color filter patterns include a first color filter pattern that corresponds to the first light emitting element,
   wherein at least one of the color filter patterns has a size smaller than that of the light emitting elements in a first direction of the first substrate, and the rest of the color filter patterns has a size larger than that of the light emitting elements in the first direction of the first substrate, wherein the first color filter pattern has a size smaller in the first direction than that of a portion of the first light emitting element where the first emitting layer is disposed directly on the first electrode.

2. The display device of claim 1, wherein the color filter patterns include a second color filter pattern corresponding to a green color, and a third color filter pattern corresponding to a blue color, wherein the first color filter pattern corresponds to a red color,
   wherein at least one color filter pattern of the first and second color filter patterns has a size smaller than that of a corresponding light emitting element.

3. The display device of claim 2, wherein the third color filter pattern has a size equal to or larger than that of a corresponding light emitting element.

4. The display device of claim 2, wherein the light emitting elements include:
   a second light emitting element corresponding to the second color filter pattern, the second light emitting element emitting light of a second color; and
   a third light emitting element corresponding to the third color filter pattern, the third light emitting element emitting light of a third color, wherein the first light emitting element emitting light of a first color.

5. The display device of claim 4, wherein the second light emitting element includes:
- a second emitting layer having a size smaller than that of the second color filter pattern in the first direction of the first substrate;
- a third electrode disposed between the first substrate and the second emitting layer; and
- a fourth electrode disposed on the second emitting layer.

6. The display device of claim 4, wherein the third light emitting element includes:
- a third emitting layer having a size smaller than that of the third color filter pattern in the first direction of the first substrate;
- a fifth electrode disposed between the first substrate and the third emitting layer; and
- a sixth electrode disposed on the third emitting layer.

7. The display device of claim 1, further comprising a filling layer disposed between the light emitting elements and the color conversion layer.

8. The display device of claim 7, wherein the filling layer includes an adhesive insulating material.

9. The display device of claim 1, wherein the color conversion layer is disposed on a second substrate opposite to the first substrate.

10. The display device of claim 9, wherein the color conversion layer further includes a black matrix disposed between the color filter patterns.

11. The display device of claim 1, further comprising a plurality of thin film transistors disposed in the pixel region, the plurality of thin film transistors being connected to respective light emitting elements.

12. The display device of claim 11, wherein each of the plurality of thin film transistors includes:
- an active pattern disposed on the first substrate;
- a gate electrode disposed on the active pattern; and
- a source electrode and a drain electrode, each connected to the active pattern.

13. A display device comprising:
- a first substrate including a pixel region and a peripheral region at least partially surrounding the pixel region;
- a plurality of pixels disposed in the pixel region, the plurality of pixels including first, second and third sub-pixels, wherein the first sub-pixel includes a first light emitting element including a first electrode disposed on the first substrate, a first emitting layer directly disposed on the first electrode, and a second electrode disposed on the first emitting layer, and the second sub-pixel includes a second light emitting element including a third electrode disposed on the first substrate, a second emitting layer directly disposed on the third electrode, and the second electrode, wherein the second electrode is disposed on the second emitting layer; and
- a color conversion layer including a first color filter pattern corresponding to the first light emitting element, a second color filter pattern corresponding to the second light emitting element, and a black matrix overlapping at least one of a portion of the first light emitting element where the first emitting layer is directly disposed on the first electrode or a portion of the second light emitting element where the second emitting layer is directly disposed on the third electrode,
wherein a width of the first color filter pattern is smaller than a width of the first emitting layer, and/or a width of the second color filter pattern is smaller than a width of the second emitting layer.

14. The display device of claim 13, wherein the width of the first color filter pattern is smaller than the width of the first emitting layer, and the width of the second color filter pattern is smaller than the width of the second emitting layer.

15. The display device of claim 13, wherein the black matrix at least partially surrounds the first color filter pattern and the second color filter pattern.

16. The display device of claim 15, wherein the black matrix partially overlaps the first emitting layer and the second emitting layer.

17. The display device of claim 13, wherein the third sub-pixel includes a third light emitting element including a third emitting layer, and the color conversion layer further includes a third color filter pattern corresponding to the third light emitting element.

18. The display device of claim 17, wherein a width of the third color filter pattern is equal to or larger than a width of the third emitting layer.

19. A display device comprising:
- a first substrate including a display area and a non-display area;
- a plurality of pixels disposed in the display area, the plurality of pixels including first, second and third sub-pixels, wherein the first sub-pixel includes a first electrode disposed on the first substrate, a first emitting layer disposed directly on the first electrode, and a second electrode disposed on the first emitting layer, the second sub-pixel includes a second emitting layer, and the third sub-pixel includes a third emitting layer; and
- a color conversion layer including a first color filter pattern corresponding to the first emitting layer, a second color filter pattern corresponding to the second emitting layer, a third color filter pattern corresponding to the third emitting layer, and a black matrix at least partially surrounding the first, second and third color filter patterns,
wherein the black matrix partially overlaps at least one of the first emitting layer or the second emitting layer, and the black matrix does not overlap the third emitting layer, wherein the first color filter pattern has a size smaller in a first direction of the first substrate than that of a portion of the first emitting layer directly contacting the first electrode.

* * * * *